United States Patent [19]

Baliga

[11] 4,331,969
[45] May 25, 1982

[54] FIELD-CONTROLLED BIPOLAR TRANSISTOR

[75] Inventor: B. Jayant Baliga, Schenectady, N.Y.

[73] Assignee: General Electric Company, Schenectady, N.Y.

[21] Appl. No.: 923,936

[22] Filed: Jul. 13, 1978

Related U.S. Application Data

[63] Continuation of Ser. No. 739,750, Nov. 8, 1976, abandoned.

[51] Int. Cl.³ .................. H01L 27/02; H01L 29/80
[52] U.S. Cl. ............................ 357/43; 357/23
[58] Field of Search .................... 357/22, 43

[56] References Cited

U.S. PATENT DOCUMENTS

| | | | |
|---|---|---|---|
| 2,754,431 | 7/1956 | Johnson | 357/43 |
| 3,465,216 | 9/1969 | Teszner | 357/22 |
| 3,814,995 | 6/1974 | Teszner | 357/22 |
| 3,953,879 | 4/1976 | O'Connor-d'Arlach et al. | 357/22 |
| 4,037,245 | 7/1977 | Ferro | 357/22 |
| 4,150,304 | 4/1979 | Jensen | 357/24 |

Primary Examiner—Gene M. Munson
Attorney, Agent, or Firm—Marvin Snyder; James C. Davis, Jr.

[57] ABSTRACT

A field-controlled bipolar transistor characterized by a bidirectional voltage blocking capability between the collector and emitter electrodes is described as comprising a semiconductor substrate with base, emitter and collector regions formed in the semiconductor substrate with the base region of one conductivity type and the emitter and collector regions of opposite conductivity type. A gate region, also of opposite conductivity type, is formed in the substrate and positioned with respect to the emitter and collector regions so that when the junction formed between the gate region and the substrate is reverse-biased, a depletion region forms which pinches off current flow between the emitter and collector regions thereby providing a transistor that is capable of blocking high voltages in both forward and reverse directions while having normal bipolar transistor characteristics in the forward direction.

6 Claims, 6 Drawing Figures

FIELD-CONTROLLED BIPOLAR TRANSISTOR

This is a continuation of application Ser. No. 739,750, filed Nov. 8, 1976, now abandoned.

The present invention relates to bipolar transistor devices and more particularly to a new and improved bipolar transistor capable of blocking bidirectional voltages.

Currently, high voltage bipolar transistors are generally constructed in a high resistivity substrate which functions as the collector region with diffused base and emitter regions formed therein. Where the bipolar transistor is an N-P-N type, normal transistor action is achieved by biasing the collector positive with respect to the emitter and the base less positive with respect to the emitter. When biased in this way, the transistor exhibits the well-known common emitter characteristics of a bipolar transistor. In this configuration, the maximum voltage that can be applied between collector and emitter before avalanche breakdown occurs is referred to as the blocking voltage of the device. By appropriate transistor design collector breakdown voltages of up to approximately 1000 volts are currently available.

If the collector voltage is reversed, i.e., a negative voltage is applied to the collector of an N-P-N transistor, the applied voltage must be supported at the reverse biased emitter-base junction. However, since the emitter is usually formed by a shallow planar diffusion in the surface of the semiconductor substrate, and further since the emitter and base regions are frequently interdigitated to increase the current-handling capability of the device, the emitter-base junction usually cannot support high voltages and frequently breaks down at less than 100 volts. As a result, bipolar transistors are limited to those applications where a blocking voltage of one polarity is required.

It is therefore an object of this invention to provide a bipolar transistor structure capable of blocking voltages in both polarities of collector bias while having normal bipolar transistor characteristics with one polarity of bias.

Briefly, and in accordance with a preferred embodiment of the present invention, a typical bipolar transistor structure including base, emitter and collector regions is provided with a gate region which forms a P-N junction with the substrate such that when reverse biased, a depletion region forms in the substrate and pinches off current flow between the emitter and collector regions when such regions are subjected to a reverse polarity voltage. By appropriately selecting the geometry of the field-controlled bipolar transistor device, the bias voltage required at the gate region is a factor G less than the voltage applied between the collector and emitter regions. Since the factor G can range between 10 and 100, large reverse blocking voltages are achieved in accordance with the present invention.

Other objects and advantages of the invention, along with a more complete description thereof are provided below in conjunction with the accompanying drawings in which.

Figure 1:
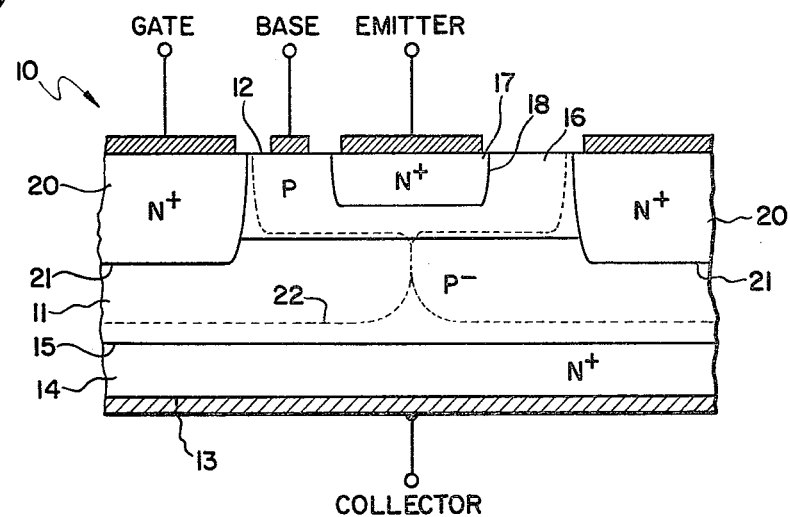
FIG. 1 is a partial sectional view of a preferred embodiment of an electric field-controlled bipolar transistor in accordance with the present invention.

FIG. 1 illustrates a preferred embodiment of an electric field-controlled bipolar transistor 10 constructed in accordance with the present invention. The transistor 10 comprises a semiconductor substrate 11 of one-type conductivity, such as P-type, for example, with opposed major surfaces 12 and 13. The substrate 11 includes a region of opposite conductivity 14 which forms the collector junction 15 with the substrate 11. The surface 12 of the substrate includes a base region 16 of P-type conductivity and an emitter region 17 of N+-type conductivity. The resulting P-N junction 18 is the base-emitter junction of the transistor. The structure thus far described is substantially similar to the prior art bipolar transistor structures. However, FIG. 1 also illustrates a gate region 20 of N+-type conductivity surrounding the base and emitter regions 16 and 17, respectively. As will be described more fully below, the gate region 20 provides the reverse blocking capability of the field-controlled bipolar transistor.

Figure 4:
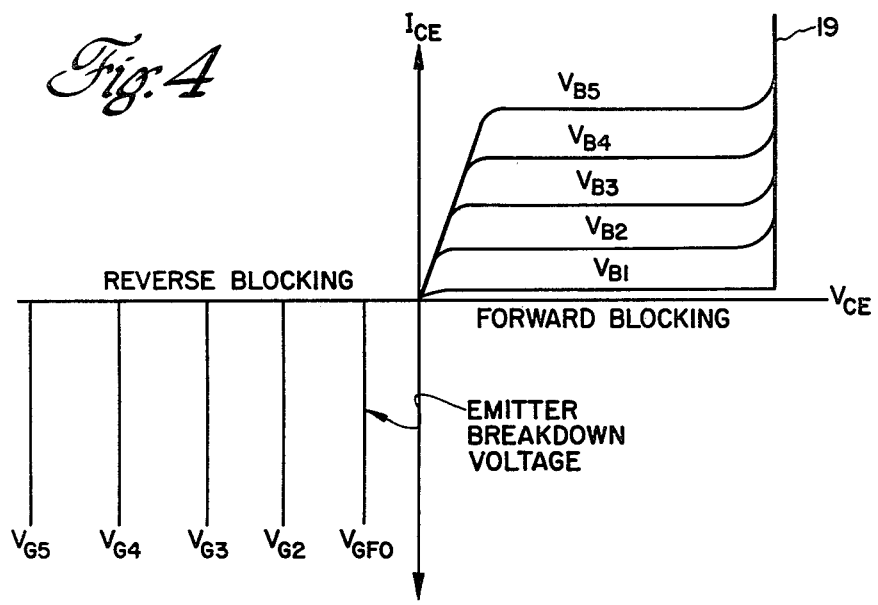
FIG. 4 is a graphic illustration of the forward and reverse current and voltage characteristics of a device constructed in accordance with the present invention.

Considering first the forward bias mode of operation, a positive voltage is applied to the collector through appropriate impedance means (not illustrated) with respect to the emitter region which, for purposes of illustration, is connected to a common ground potential. A slightly positive voltage applied to the base region with respect to the emitter region produces the typical common emitter transistor action. The righthand quadrant of FIG. 4 illustrates the voltage vs. current characteristics for such a device. As is well known in the art, the collector-base breakdown voltage determines the forward blocking capability of the device. FIG. 4 illustrates the collector breakdown voltage as occurring at the point 19. Other device characteristics such as current gain, for example, are determined by the usual transistor current gain limiting mechanisms of emitter efficiency and base transport factor. Therefore, with the gate terminal open-circuited, the device illustrated in FIG. 1 functions as a normal bipolar transistor.

When a negative voltage is applied at the collector with respect to the emitter, the voltage appears across the reverse biased emitter-base junction 18. Since this junction is a shallow, planar diffused junction, it will exhibit a voltage breakdown characteristic at generally less than 100 volts. However, upon application of a positive bias at the gate region 20 with respect to the emitter region 17, a depletion region 22 will form around the gate-substrate junction 21 which will extend to the next adjacent gate region and pinch off any reverse current flow between emitter and collector. In essence, the depletion region 22 supports the collector-emitter reverse voltage when the voltage exceeds the emitter-base breakdown voltage.

A particularly desirable characteristic of electric field-controlled bipolar transistors constructed in accordance with the present invention is the small voltage required at the gate region to produce a large voltage blocking capability between the collector and emitter regions. More specifically, because of the geometry of the device, the blocking voltage in the reverse direction is a factor G greater than the gate breakdown voltage. In general, the factor G can range between 10 and 100 and is dependent upon the geometry of the grid region and the base region, primarily being dependent on the relative depth of the grid and base regions and the spacing therebetween. Since the factor G can range between approximately 10 and 100, large reverse blocking voltages are achieved with this structure. The lower left-hand quadrant of FIG. 4 illustrates the reverse voltage blocking characteristics for a typical field-controlled bipolar transistor constructed in accordance with the present invention.

It should be understood by those skilled in the art that although the invention illustrated in the embodiment of FIG. 1 includes only a single emitter and base region, multiple interdigitated base and emitter structures, along with an interdigitated gate region, are contemplated. An example of this type of device is illustrated in FIG. 6 and will be described in greater detail below.

Figure 2:
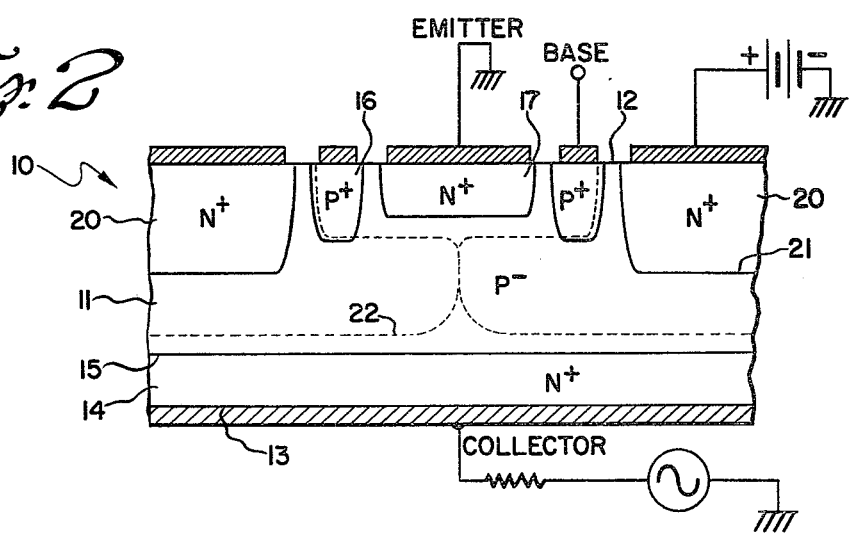
FIGS. 2 and 3 are partial sectional views of alternative embodiments of the present invention.
Figure 3:
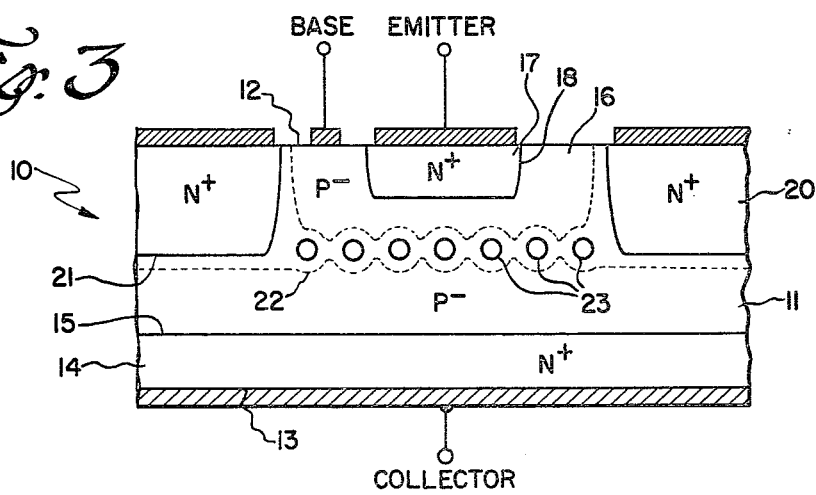

FIGS. 2 and 3 illustrate by way of further example, alternative embodiments of field-controlled bipolar transistors constructed in accordance with the present invention. As illustrated, the primary difference between the embodiment illustrated in FIG. 2 and that of FIG. 1 is the geometric shape of the base region and the resulting difference in the depletion region 22 formed around the reverse biased gate-substrate junction 21. In particular, in FIG. 2 the base region 16 prevents punch-through between the gate region 20 and the emitter region 17. In FIG. 3, a plurality of parallel grid members 23 are buried in the substrate 11 and are electrically connected to the gate regions 20. In this embodiment of the invention, the magnitude of the bias voltage required to produce pinch-off between the collector and emitter regions is substantially reduced because of the presence of the buried grid members.

Figure 5:
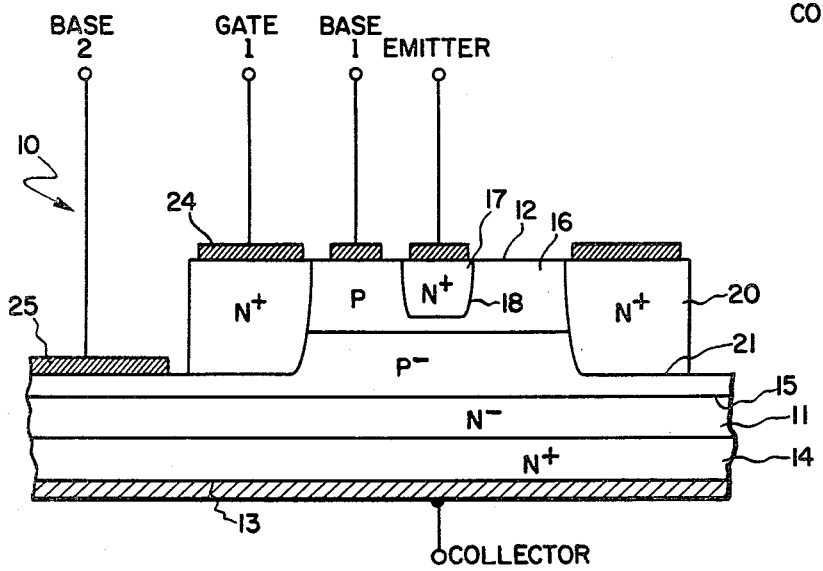

FIG. 5 illustrates yet another alternative embodiment of the present invention illustrating two possible base contact locations on the semiconductor substrate. Locating the base electrode 25 as illustrated has the advantage of using a substantial portion of the surface 12 for removing current from the base region during turn-off of the transistor. However, the presence of the base contacts on the surface 12 obviously requires larger spacing between the gate and emitter regions, undesirably decreasing the blocking voltage gain factor G. Therefore, to obtain higher blocking voltage gain factors a single base contact 25 can be located at the edge of the device as illustrated.

Figure 6:
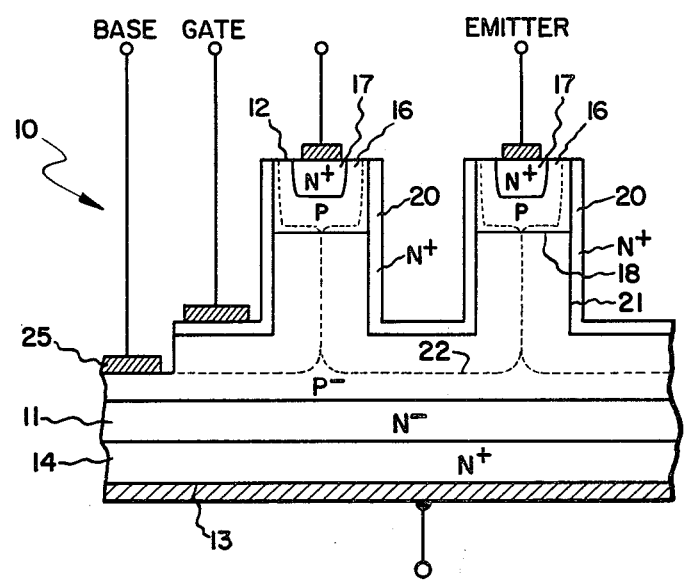
FIGS. 5 and 6 are partial sectional views of still other alternative embodiments of the present invention.

FIG. 6 illustrates another embodiment of a field-controlled bipolar transistor including multiple base-emitter regions with deep grooves separating each base-emitter region. As illustrated, the walls of the grooves are provided with a region of N+-type conductivity forming the gate region for the device. In other respects, the device illustrated in FIG. 6 is substantially similar to those described above and operates in substantially the same manner.

In summary, the field-controlled bipolar transistor in accordance with the present invention extends the present power transistor capability to handling large reverse blocking voltages in both the forward and reverse directions, much like a field-controlled thyristor but exhibits current gain in one quadrant of operation which field-controlled thyristors do not possess.

It will be apparent to those skilled in the art that various modifications and changes may be made within the spirit and scope of the invention as described. For example, complementary type devices may also be constructed in accordance with the present invention. Accordingly, the appended claims are intended to cover all such modifications and variations.

What is claimed as new is:

1. An electric field controlled three layer bipolar transistor having a bidirectional voltage blocking capability between the collector and emitter electrodes, said transistor comprising:
   a semiconductor substrate of one-conductivity type and having opposed major surfaces;
   a collector region of opposite conductivity type in one of said major surfaces;
   an emitter region of opposite conductivity type in the other major surface;
   a base region of said one-conductivity type surrounding said emitter region;
   electrode means contacting each of said collector region and said emitter region for applying across said collector region and said emitter region of said transistor a bidirectional voltage in which one polarity voltage causes said transistor to exhibit a bipolar transistor voltage-current characteristic and a forward blocking capability dependent on the collector-base breakdown voltage;
   a gate region of opposite conductivity type surrounding said base and emitter regions; and
   means for biasing said gate region to produce a depletion region in said substrate between said emitter and collector regions which pinches off current flow between said emitter and collector when the opposite polarity of said bidirectional voltage causes the collector-base junction of said transistor to become forward biased, thereby providing said transistor with reverse blocking capability.

2. The bipolar transistor of claim 1 wherein said gate region further comprises a plurality of grid members of opposite conductivity type buried in said substrate and located between said base and collector regions and effective to pinch off current flow between said emitter and collector regions upon the application of a reverse bias voltage to said gate region.

3. The bipolar transistor of claim 1 wherein said other surface of said substrate includes a plurality of grooves therein with the walls of said grooves being of opposite conductivity type and comprising said gate region.

4. In combination with a three layer bipolar transistor structure having base, emitter and collector regions formed in a semiconductor substrate with said base region of one conductivity type and said emitter and collector regions of opposite conductivity and electrode means contacting said collector and emitter regions for applying across said collector and emitter regions of said transistor a bidirectional voltage in which one polarity causes said transistor to exhibit a bipolar transistor voltage-current characteristic and a forward blocking capability dependent on the collector-base breakdown voltage, the improvement comprising a gate region of opposite conductivity type in said substrate, said gate region surrounding said base and emitter regions and effective to produce a depletion region in said substrate between said emitter and collector regions which pinches off current flow between said emitter and collector regions when the opposite polarity of said bidirectional voltage causes the collector-base junction of said transistor to become forward biased, thereby providing said transistor with reverse blocking capability.

5. The combination of claim 4 further comprising means for applying a reverse bias voltage to said gate region for forming said depletion region, the magnitude of said reverse bias voltage being approximately 10 to 100 times less than the magnitude of said bidirectional voltage.

6. The combination of claim 4 wherein said transistor includes multiple base and emitter and gate regions interdigitated on the surface of said substrate.

* * * * *